US010739453B2

(12) United States Patent
Schmidt et al.

(10) Patent No.: US 10,739,453 B2
(45) Date of Patent: Aug. 11, 2020

(54) ULTRASONIC MEASURING SYSTEM, IN PARTICULAR FOR MEASURING DISTANCE AND/OR AS A PARKING AID IN VEHICLES

(71) Applicant: Elmos Semiconductor Aktiengesellschaft, Dortmund (DE)

(72) Inventors: Andre Schmidt, Dortmund (DE); Egbert Spiegel, Dortmund (DE); Guido Schlautmann, Dortmund (DE); Stefanie Heppekausen, Dortmund (DE)

(73) Assignee: Elmos Semiconductor Aktiengesellschaft, Dortmund (DE)

( * ) Notice: Subject to any disclaimer, the term of this patent is extended or adjusted under 35 U.S.C. 154(b) by 0 days.

(21) Appl. No.: 16/077,147

(22) PCT Filed: Feb. 14, 2017

(86) PCT No.: PCT/EP2017/053287
§ 371 (c)(1),
(2) Date: Aug. 10, 2018

(87) PCT Pub. No.: WO2017/140673
PCT Pub. Date: Aug. 24, 2017

(65) Prior Publication Data
US 2019/0025425 A1 Jan. 24, 2019

(51) Int. Cl.
*G01S 15/931* (2020.01)
*G01S 7/523* (2006.01)
(Continued)

(52) U.S. Cl.
CPC .......... *G01S 15/931* (2013.01); *B06B 1/0215* (2013.01); *B60Q 9/006* (2013.01);
(Continued)

(58) Field of Classification Search
CPC ... B06B 1/0215; B06B 2201/30; B60Q 9/006; G01F 1/667; G01F 23/2962; G01S 7/52;
(Continued)

(56) References Cited

U.S. PATENT DOCUMENTS 3,639,858 A * 2/1972 Miyata ............... H03B 7/06
331/108 R
4,156,823 A * 5/1979 Suzuki .............. B06B 1/0215
310/317
(Continued)

FOREIGN PATENT DOCUMENTS

DE 2935038 A1 3/1981
DE 3602857 A1 8/1987
(Continued)

*Primary Examiner* — Stephen R Burgdorf
(74) *Attorney, Agent, or Firm* — Bejin Bieneman PLC (57) ABSTRACT

The invention relates to an ultrasonic measuring system (10), in particular for measuring distance and/or as a parking aid in vehicles, having an electroacoustic ultrasonic transducer (12) which has a oscillating element (14), does not have a voltage converter, can be alternately operated as an ultrasonic transmitter and an ultrasonic receiver and has a signal connection (16), which is used either as an input or as an output of the ultrasonic transducer (12), and an earth connection (18) which is connected to earth, and a control and evaluation unit (20) for exciting the oscillating element (14) of the ultrasonic transducer (12) to emit ultrasonic waves for operating the ultrasonic transducer (12) during a transmission interval for the purpose of subsequently deactivating the excitation of the oscillating element (14) and attenuating the latter during a decay phase and for receiving and processing ultrasonic waves in a reception interval. The control and evaluation unit (20) has a bridge circuit (28) which is connected to a DC supply voltage (80) and has controllable switches (30 to 40) and a charge storage capacitance (42), the polarity of which can be reversed and which
(Continued)

is intended to alternately output a positive and a negative excitation voltage for the signal connection (16) of the ultrasonic transducer (12) during the transmission interval. The control and evaluation unit (20) outputs a voltage pulse of substantially 0 V at the end of the transmission interval for the signal connection (16) of the ultrasonic transducer (12).

18 Claims, 10 Drawing Sheets

(51) Int. Cl.
- *B06B 1/02* (2006.01)
- *B60Q 9/00* (2006.01)
- *G01S 7/52* (2006.01)
- *G01S 7/524* (2006.01)
- *G01S 7/527* (2006.01)
- *H03H 11/40* (2006.01)
- *G01S 15/10* (2006.01)

(52) U.S. Cl.
CPC .......... *G01S 7/523* (2013.01); *G01S 7/52004* (2013.01); *G01S 7/524* (2013.01); *G01S 7/527* (2013.01); *H03H 11/40* (2013.01); *B06B 2201/30* (2013.01); *G01S 15/102* (2013.01); *G01S 2015/932* (2013.01)

(58) Field of Classification Search
CPC ...... G01S 7/52004; G01S 7/523; G01S 7/524; G01S 7/527; G01S 7/529; G01S 15/102; G01S 15/93; G01S 15/931; G01S 2015/932; G10K 9/18; H03H 11/40
USPC ........................................................ 340/435
See application file for complete search history.

(56) References Cited

U.S. PATENT DOCUMENTS

| | | | | |
|---|---|---|---|---|
| 4,676,251 A | * | 6/1987 | Bernatets | G01S 7/52025 600/442 |
| 4,701,893 A | * | 10/1987 | Muller | G01S 15/101 367/137 |
| 6,474,164 B1 | * | 11/2002 | Mucciardi | G01N 29/36 73/602 |
| 6,731,569 B2 | | 5/2004 | Yurchenko et al. | |
| 2007/0257748 A1 | * | 11/2007 | Kawai | H03H 11/48 333/214 |
| 2010/0231239 A1 | * | 9/2010 | Tateishi | G01D 5/24 324/672 |
| 2013/0188457 A1 | * | 7/2013 | Nielsen | B06B 1/0215 367/135 |
| 2016/0173981 A1 | * | 6/2016 | Koudar | G01S 7/524 367/140 |
| 2016/0284967 A1 | * | 9/2016 | Kruecken | H01L 41/042 |
| 2018/0364341 A1 | * | 12/2018 | Ding | G01S 7/524 |

FOREIGN PATENT DOCUMENTS

| | | |
|---|---|---|
| DE | 10136628 A1 | 2/2003 |
| DE | 102009027221 A1 | 12/2010 |
| DE | 102010039017 A1 | 2/2012 |
| DE | 102011017601 A1 | 10/2012 |
| DE | 10214202869 A1 | 8/2015 |
| EP | 0571566 A1 | 12/1993 |
| EP | 0623395 A1 | 11/1994 |
| GB | 2493337 A | 6/2013 |
| WO | 2012163598 A1 | 12/2012 |
| WO | 2014166835 A1 | 10/2014 |
| WO | WO2014166835 A1 * 10/2014 ........... G01S 15/931 |

\* cited by examiner

ULTRASONIC MEASURING SYSTEM, IN PARTICULAR FOR MEASURING DISTANCE AND/OR AS A PARKING AID IN VEHICLES

CROSS REFERENCE TO RELATED APPLICATIONS

This application is a National Stage filing of PCT Application No.: PCT/EP2017/053287, filed Feb. 14, 2017, which claims priority to European Patent Application No.: 16156068.5, filed Feb. 17, 2016, both of which are incorporated herein by reference.

The invention relates to an ultrasonic measuring system which is particularly suited for measuring distance and/or as a parking aid in vehicles.

Ultrasonic measuring systems are used in particular for measuring distances and/or ranges. A major field of application of such ultrasonic measuring systems is their use as a parking aid in vehicles.

Generally speaking, it applies to ultrasonic measuring systems that ultrasonic waves are emitted from an ultrasonic transmitter, which waves, when they impinge on an obstacle, are reflected by the same and are received by an ultrasonic receiver. Based on the propagation time between the emission of the ultrasonic waves and the reception of echoes of the ultrasonic waves, it is then possible to conclude on the distance of the obstacle from the ultrasonic transmitter or receiver, respectively. However, ultrasonic measuring systems are also used to monitor spaces and to detect persons present in monitored spaces.

For a reliable detection of echo signals coming from objects farther away, the energy of the emitted ultrasonic waves should be sufficiently high. Therefore, electro-acoustic ultrasonic transducers of such ultrasonic systems are operated with a transformer or a voltage converter at the input. However, this causes an increase in the manufacturing costs of ultrasonic transducers, which has negative effects in particular with parking aids for vehicles, since such parking aids mostly comprise a plurality of ultrasonic transducers.

An ultrasonic measuring system may e.g. comprise an ultrasonic transmitter and an ultrasonic receiver, which are configured as separate individual components. However, it is much more advantageous, in particular with a view to reduced space requirement and lower production costs, to use an ultrasonic transducer that operates as an ultrasonic transmitter in one transmission interval and operates as an ultrasonic receiver in a receiving interval chronologically after the transmission interval. During the transmission interval, the ultrasonic transducer is controlled in particular by a burst control signal whereby an electro-acoustic oscillating element of the ultrasonic transducer is caused to vibrate and is thereby excited. However, after this control has been terminated, the oscillating element at first decays. During this time, echoes coming from objects arranged close to the ultrasonic transducer, cannot be detected with certainty so that the above-mentioned type of ultrasonic transducers is only of limited use in near-distance measuring.

For a shortening of the decay time of an ultrasonic transducer, it is known to dampen the oscillating element thereof (see EP-B-0 571 566, EP-B-0 623 395, WO-A-2012/163598, U.S. Pat. No. 6,731,569 and GB-A-2 493 337). For this purpose, according to DE-A-36 02 857) a resistor is activated in an ultrasonic transducer already in the transmission interval.

WO-A-2014/166835 describes the control the ultrasonic transducer with counter-pulses upon termination of the transmission interval and/or with the beginning of the receiving interval.

According to DE-A-10 2009 027 221 and DE-A-10 2010 039 017, one or a plurality of damping pulses are applied to the oscillating element.

DE-A-101 36 628 and DE-A-10 2014 202 869 describe further methods and devices for controlling an ultrasonic transducer. From DE-A-10 2011 017 601 a controlling method for an inverter and an inverter arrangement, in particular a solar cell inverter, are known and a circuit arrangement for generating a sinusoidal AC voltage of constant frequency from a DC voltage is known from DE-A-29 35 038.

For reasons of a simplified realization of a reliable ESD protection, it is known to connect one of the two terminals of an ultrasonic transducer to ground potential. For its operation as an ultrasonic transmitter, the ultrasonic transducer is controlled with an AC voltage of about 0V at the other signal terminal. If a sufficiently high operating voltage is available, this causes no further difficulties, since, e.g. between 0V and the operating voltage, a voltage swing sufficient for the operation of the ultrasonic transducer as a transmitter is available.

The situation is different, if the operating voltage is limited (e.g. 12 V), as e.g. in the onboard electrical system of vehicles. In this case it is necessary to generate an AC voltage with positive and negative values (e.g. +/−40 V) from the on-board voltage.

It is an object of the present invention to provide an ultrasonic measuring system which, given the above-mentioned constraints, can be realized with only little hardware effort.

To achieve this object, the invention proposes a system provided with an electro-acoustic ultrasonic transducer without a voltage converter and comprising a oscillating element, which transducer is configured to be operated alternately as an ultrasonic transmitter and as an ultrasonic receiver, and a signal terminal which serves either as an input or as an output of the ultrasonic transducer, and a ground terminal connected to ground or connected to ground with low resistivity, and a control and evaluation unit for exciting the oscillating element of the ultrasonic transducer for transmitting ultrasonic waves for the operation of the ultrasonic transducer during a transmission interval for the subsequent deactivation of the excitation of the oscillating element as well as for damping the same during a decay phase and for receiving, as well as for processing ultrasonic waves in a receiving interval, wherein the control and evaluation unit comprises a bridge circuit connected to a supply DC voltage, said circuit comprising controllable switches and a reversible charge storage capacitance for alternately outputting a positive and a negative excitation voltage for the signal terminal of the ultrasonic transducer during the transmission interval at an output terminal of a driver stage of the control and evaluation unit, and wherein, by connecting the output terminal to ground, the control and evaluation unit outputs a voltage pulse at the end of the transmission interval for the signal terminal of the ultrasonic transducer, the magnitude of the pulse being equal to the mean excitation voltage for a signal terminal of the ultrasonic transducer, which excitation voltage, due to the positive and negative excitation voltages for the signal terminal of the ultrasonic transducer being outputted during a transmission interval, is present at the same.

The invention is based on the use of an electro-acoustic ultrasonic transducer which is operated without a voltage transducer or a transformer and is controlled via only one of its typically two terminals or which outputs a signal at said one terminal upon receiving ultrasonic waves. The ultrasonic transducer comprises a oscillating element which is excited to vibrate during a transmission interval, i.e. which serves as an actuator and thus emits ultrasonic waves, and which in a subsequent receiving interval responds to ultrasonic waves received and is excited thereby, i.e. which serves as a sensor or receiver. The ultrasonic transducer is controlled by a control and evaluation unit, which unit evaluates signals coming from the ultrasonic transducer during the receiving interval. The charge storage capacitance is charged corresponding to the required excitation voltage of the ultrasonic transducer.

The bridge circuit ensures that selectively a positive potential of the excitation voltage and a negative potential of the excitation voltage are applied to the signal terminal of the ultrasonic transducer. The charge storage capacitance serves to generate the negative potential of the excitation voltage, the negative voltage potential of the charge storage capacitance being alternately applied to the signal terminal of the ultrasonic transducer.

With ultrasonic transducers of the above described kind, which on the one hand operate as a transmitter and shortly afterwards operate a s receiver, it is of importance that they have a decay phase as short as possible. To shorten the decay phase, the invention provides that at the time of the end of the transmission interval, the excitation voltage at the ultrasonic transducer is temporarily fixed, i.e. for substantially the duration of a control pulse, e.g. for the duration of an interval from $0.25 \times 1/f_{control\ pulse}$ to $1.0 \times 1/f_{control\ pulse}$ (where $f_{control\ pulse}$ is equal to the frequency at which the control pulses are outputted). Thereby, the amplitude is reduced during the decay phase.

More specifically, according to the invention, the control and evaluation unit generates a voltage pulse at its output terminal at the end of a transmission interval, the voltage pulse having a magnitude equal to the mean excitation voltage present during the transmission interval at the signal terminal of the ultrasonic transducer and thus at the output terminal of the control and evaluation unit. This mean voltage may be e.g. between 0 V and 1.65 V. The reasons for this will be described hereinafter.

In an advantageous development of the invention it is provided that the control and evaluation unit comprises a damping inductance which is activated by the control and evaluation unit at the end of the transmission interval at the earliest and is deactivated during the duration of the decay phase. By controlling the ultrasonic transducer with an excitation voltage of, as explained above, substantially 0 V, a voltage is present at the ultrasonic transducer for a short time and immediately at the end of the transmission interval and thus immediately before the beginning of the decay phase, the magnitude of which voltage being in the range in which the damping inductivity operates effectively. The decay phase is shortened thereby so that it is possible to even detect echoes caused by objects located near the ultrasonic transducer.

As a rule, the control and evaluation unit is configured as a part of an IC. Realizing inductances in ICs is problematic. Therefore, it is known to realize inductances in ICs by means of so-called impedance converter circuits. An example for such an impedance converter circuit (so-called electronic coil) is described in "The Circuits And Filters Handbook", second Edition, Editor-in-Chief Way-Kay Chen, pages 394-397, 10 2003, CRC Press LLC, ISBN 0-8493-0912-3.

The operation of an impedance converter circuit requires a DC voltage. Since the impedance converter circuit itself has to be connected to the above-mentioned signal terminal of the ultrasonic transducer to be able to perform the damping function, a decoupling capacitance can be connected between the impedance converter circuit and the signal terminal of the ultra-sonic transducer. Another aspect for decoupling the operating voltage of the impedance converter circuit or its output voltage from the ultrasonic transducer, is that the ultrasonic transducer is thus not permanently supplied with a DC voltage, which could compromise its behavior over its useful life.

However, the charge of the decoupling capacitance changes during the transmission interval, due to the varying excitation voltage for the ultrasonic transducer. Thus, at the end of the transmission interval, the voltage on the ultrasonic transducer is no longer exactly 0 V. This in turn influences the decay behavior of the oscillating element.

The signal present at the ultrasonic transducer is amplified by an amplifier of the control and evaluation unit at least during the decay phase and during the receiving interval, to be thereafter evaluated for the detection of echoes. The decay phase is critical for the evaluation of the amplified signal. That is, if the mean decay signal does not decay fast enough, the output signal of the amplifier or the envelope of the output signal could indicate the presence of a "near" obstacle which, however, is actually non-existent.

For the amplifier to follow the decay signal more quickly, an advantageous embodiment of the invention provides a filter arranged between the signal terminal of the ultrasonic transducer and the input of the amplifier, the filter having a switchable filter constant so as to act as a high-pass filter during the decay phase, in particular after the deactivation of the damping function. The filter constant is reset after a certain time and towards the end of the decay phase.

As already mentioned above, the control and evaluation circuit comprises a charge storage capacitance. During the transmission interval, this charge storage capacitance is intermittently connected to the operating voltage in a repeated manner via the bridge circuit and is thereby charged. However, prior to the start of the transmission interval, it is feasible to charge the charge storage capacitance via a power source of the control and evaluation unit. At this time, the charge storage capacitance is largely discharged so that comparatively high charging currents would flow which could possibly compromise the functionality of the switches of the bridge circuit.

The following is a detailed explanation of the invention with reference to an embodiment and to the drawings. The Figures respectively show:

FIG. 1 an electric circuit, partly as a block diagram, for controlling an ultrasonic transducer and for evaluating echo signals received by the ultrasonic transducer, FIG. 2 a detailed circuit to clarify the blocks labeled driver, electric damping and receiver in FIG. 1, FIG. 3 a diagram with the signal characteristic of the different ultrasonic transducer control signals and evaluation signals, as well as control signals for the various switches of the circuit of FIGS. 1 and 2, FIG. 4 the circuit of FIG. 2 with the switch positions in the phase of charging the charge storage capacitance prior to a transmission interval, FIGS. 5 and 6 the two switch position situations during a transmission interval, which follow each other alternately, FIG. 7 the switch position at the end of a transmission interval after activation of the damping for the decay, FIG. 8 the switch position at the end of a transmission interval for generating a stop pulse, FIG. 9 the switch position at the end of a transmission interval for generating a stop pulse according to a third variant, and FIG. 10 the switch position in the case that, for preventing echo misinterpretations or echo misinterpretations caused by too fast a decay, the filter at the input of the amplifier is operated with the switchable filter constant.

Figure 1:
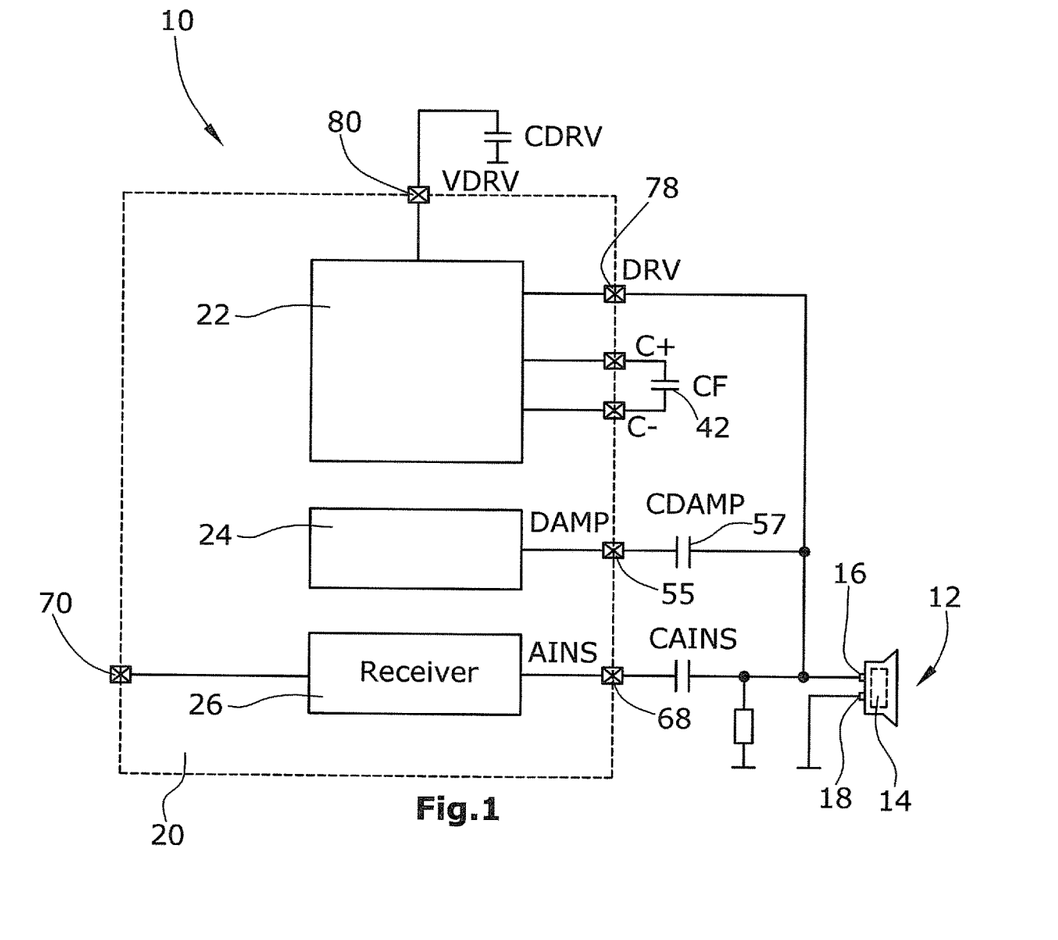

FIG. 1 is a block diagram illustrating an embodiment of an ultrasonic measuring system 10 according to the invention. The ultrasonic measuring system 10 comprises an ultrasonic transducer 12 with a oscillating element 14. The ultrasonic transducer 12 is alternately operated as a transmitter and as a receiver. It should be pointed out here that the ultrasonic transducer 12 is operated without a voltage converter or a transformer.

The ultrasonic transducer 12 has two terminals, i.e. a signal terminal 16 and a ground terminal 18 connected to ground. At the signal terminal 16, in a transmission interval, the control signal generated by a control and evaluation unit 20 for generating ultrasonic waves is present on the one hand and, on the other hand, in a receiving interval, the measuring signal outputted by the ultrasonic transducer 12 upon the reception of echoes of the ultrasonic waves emitted before is present, which signal is evaluated by the control and evaluation unit 20. The control and evaluation unit can very roughly be divided into a driver stage 22, a damping stage 24 for electric damping, and an amplifier and evaluation stage 26. These three functional groups will be explained hereinafter in terms of circuit technology with reference to FIG. 2.

Figure 2:
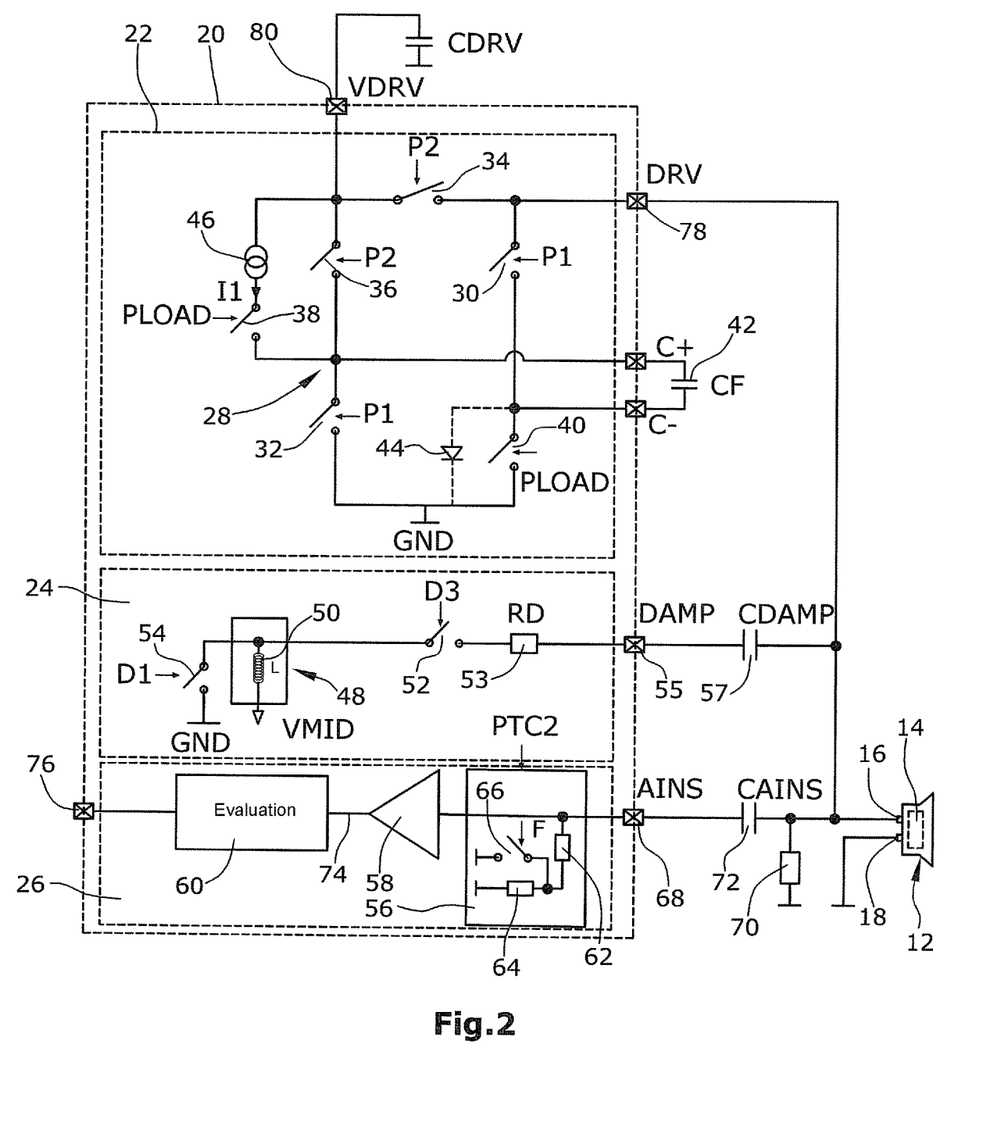

The driver stage 22 includes a bridge circuit 28 with switches 30, 32, 34, 36, 38, 40, a capacitance 42 and a diode 44. Further, the driver stage 22 includes a power source 46. The damping stage 24 for electric damping is provided with an impedance converter circuit 48 for realizing an inductance 50 in an integrated circuit (IC), as well as with two switches 52, 54 and a resistor 53. The damping stage 24 eventually also includes a decoupling capacitance 57 which, however, is not ultimately necessary.

The decoupling capacitance 57 is connected between the output 55 of the stage 24 and the signal terminal 16 of the ultrasonic transducer 12.

Finally, the amplifier and evaluation stage 26 in combination with the capacitance 72 comprises a filter 56, an amplifier 58 and an evaluation circuit 60. In the present embodiment, the integrated (IC) part of the filter 56 configured as a voltage divider with two resistors 62, 64 and a switch 66, via which the resistor 64 can be connected to ground and can thus be shunted.

A resistor 70 connected to ground and a capacitance 72 are connected between the signal terminal 16 of the ultrasonic transducer 12 and the input 68 of the amplifier and evaluation stage 26. Together with the capacitance 72, the filter acts as a high-pass.

Figure 3:
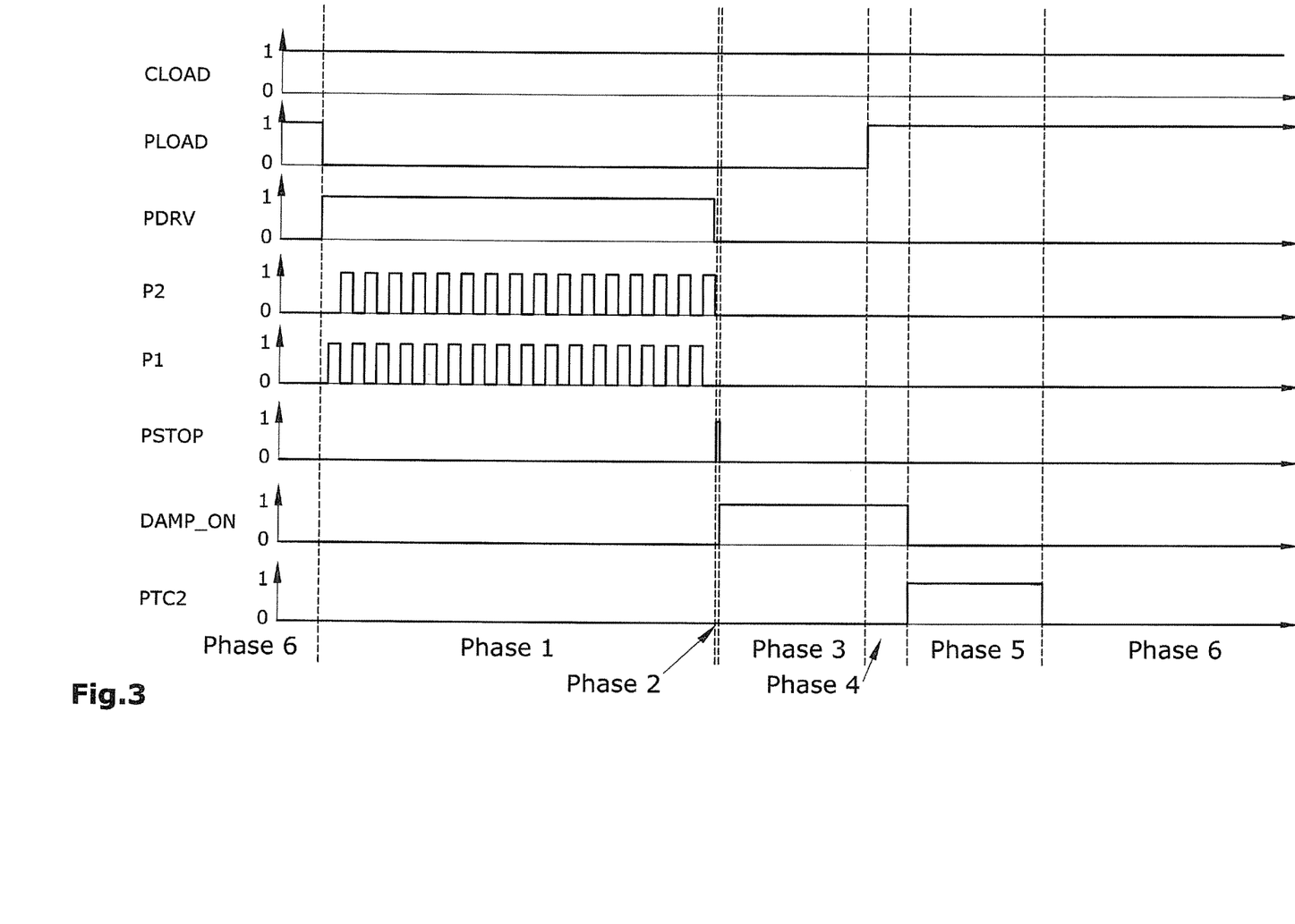

FIG. 3 illustrates the signal characteristics of the control signals mentioned in FIG. 2 (the comment would be valid only for the Figure with the simulation graphs not yet inserted). FIG. 3 further illustrates that a control and evaluation cycle of the ultrasonic measuring system 10 includes a transmission interval (phase 1), a stop pulse (phase 2), a decay phase (phases 3 ad 4 for dampening and phase 5 for switching the filter constant) and a receiving interval (phase 6) for receiving real echoes. The overall duration of the cycle may e.g. be in the range of ms (e.g. 12 to 15 ms), where the duration of phases 1 and 3 to 5 are each about two orders of magnitude shorter (e.g. phase 1 ca. 300 μs, phases 3 and 4 together ca. 700 μs and phase 5 ca 180 μs), thus, phase 6 is by far the longest phase of the cycle.

Figure 4:
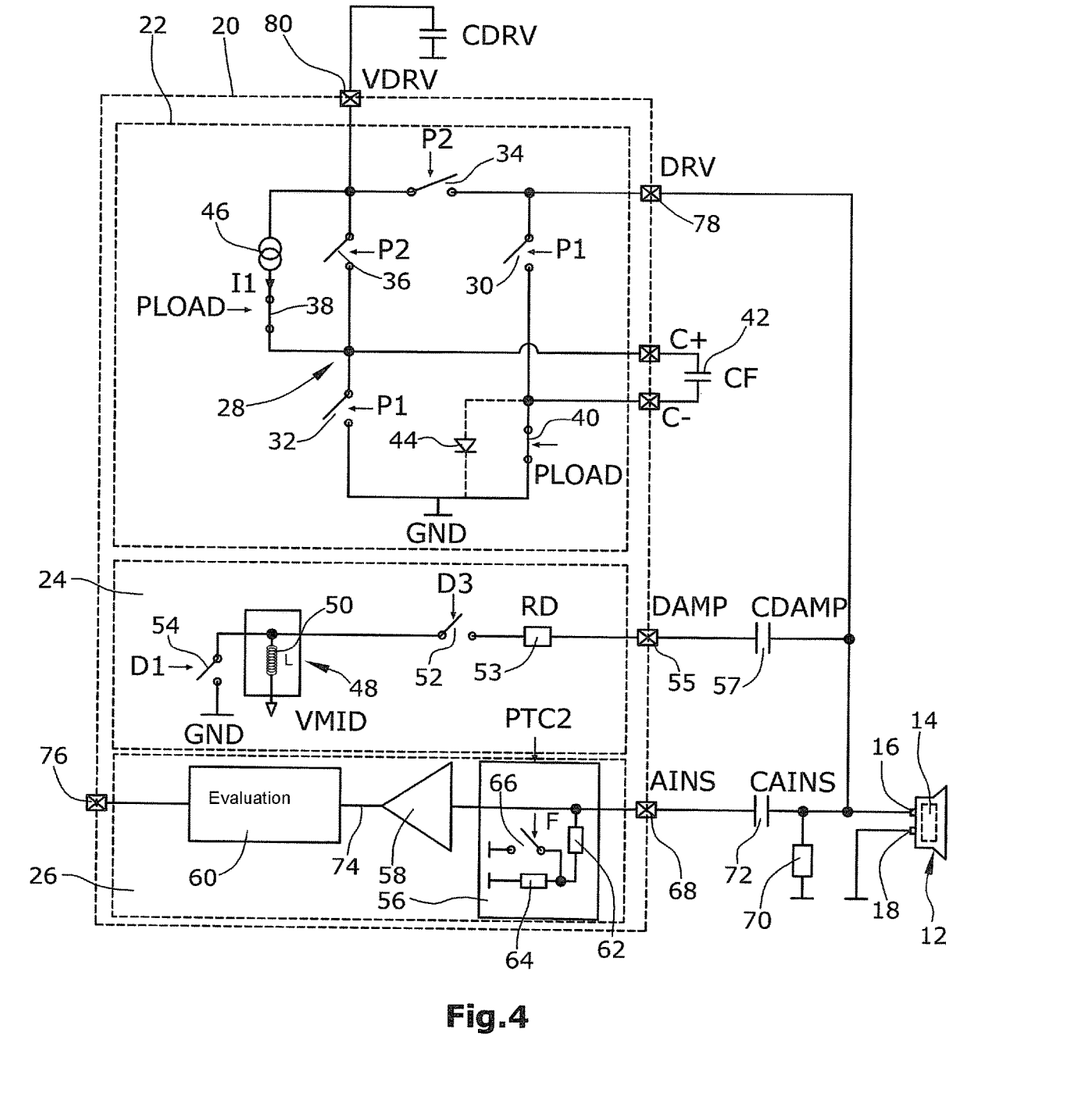

FIG. 4 shows the situation prior to a transmission interval for charging the charge storage capacitance 42. The switches 38 and 40 are closed (with the switches 30, 32, 34, 36 of the bridge circuit 28 open), so that the charge storage capacitance 42 is charged by the current I1 of the power source 46. Basically, it would be possible in this phase to charge the charge storage capacitance 42 by closing the switch 36 and the switch 40, instead of charging it by the power source 46. However, since the charge storage capacitance 42 is almost completely discharged, there is a risk that, in the start phase of the charging process, an excessive current could flow via the switches 36 and 40 that could destroy the switches 36, 40. Therefore, it is feasible to limit, as it were, the charging current by means of the power source 46. After the termination of the charging phase, the switches 38, 40 are opened.

Figure 5:
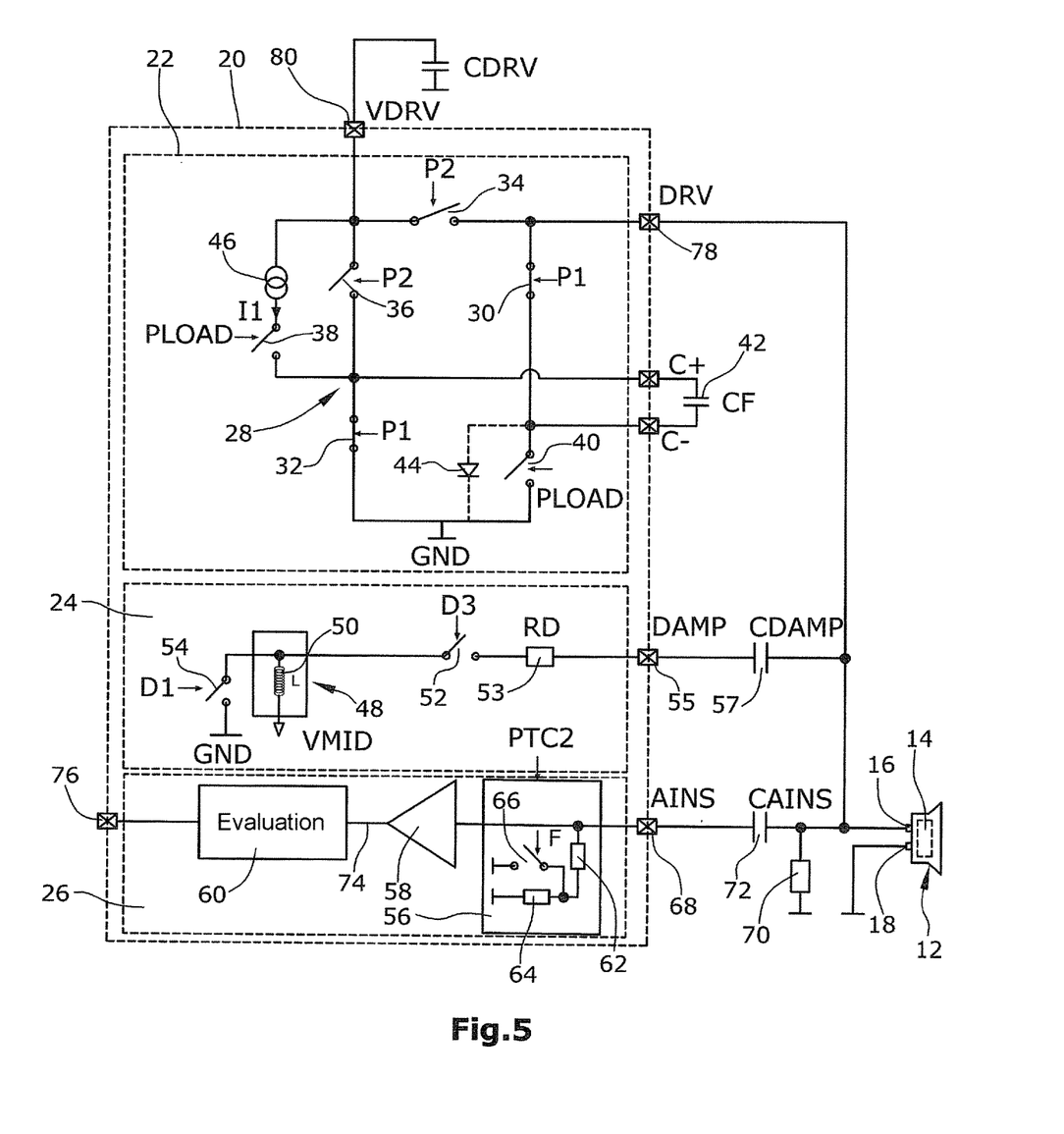
Figure 6:
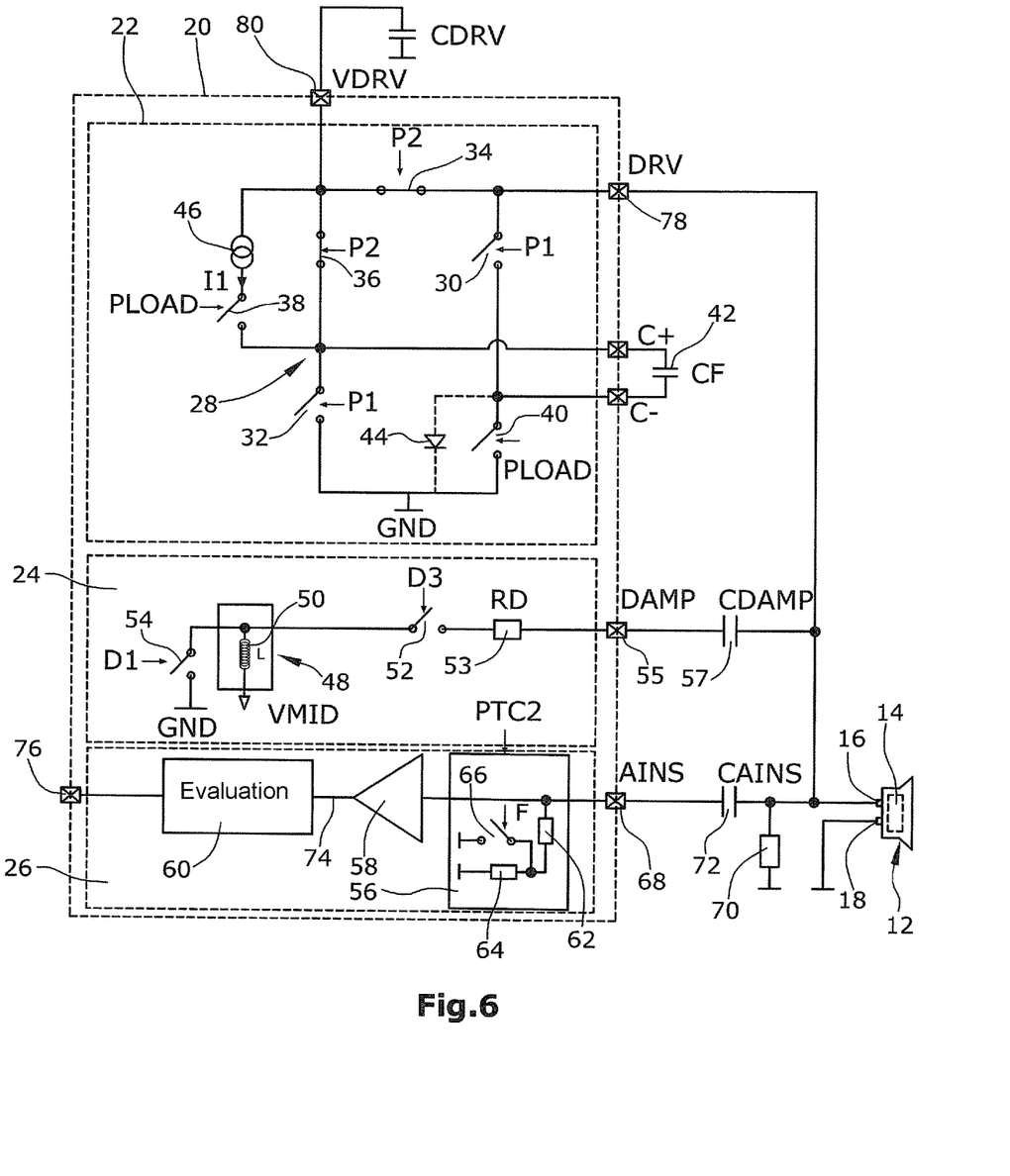

FIG. 5 shows the switch constellation in the driver stage 22 at the start of the transmission interval. First, the switches 30, 32 are closed (and the switches 34, 36) are open so that the negative potential at the charge storage capacitance 42 is connected to the output 78 of the driver stage 22 and is thus present at the signal terminal 16 of the ultrasonic transducer 12. With the switch position for a short current pulse being as illustrated in FIG. 5, the switches are thereafter switched over as shown in FIG. 6. Now, the previously closed switches 34, 36 are closed so that the operating voltage potential VDRV 80 is present at the positive potential terminal of the charge storage capacitance 42. Thus, the charge storage capacitance 42 is charged intermittently. However, at the same time, the operating voltage potential 80 is present at the output 78 of the driver stage 22 and thus at the signal terminal 16.

Figure 7:
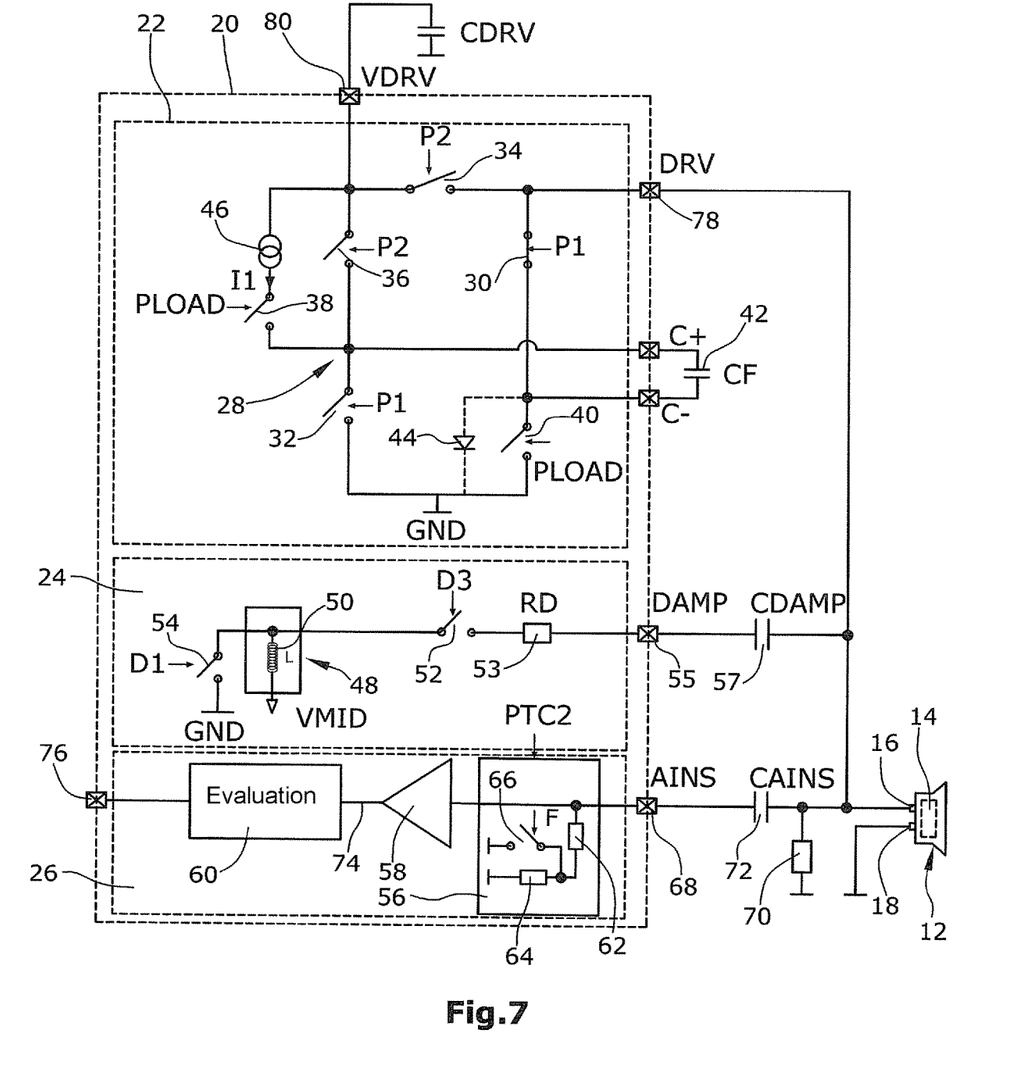

Near the end or exactly at the end of the transmission interval, the output 78 of the driver stage 22 is compulsorily supplied with ground potential, i.e. 0 V. This is effected by closing the switch 30, while the switches 32, 34, 36 are open. The output 78 of the driver stage 22 is connected to ground via the diode 44 (FIG. 7).

Figure 8:
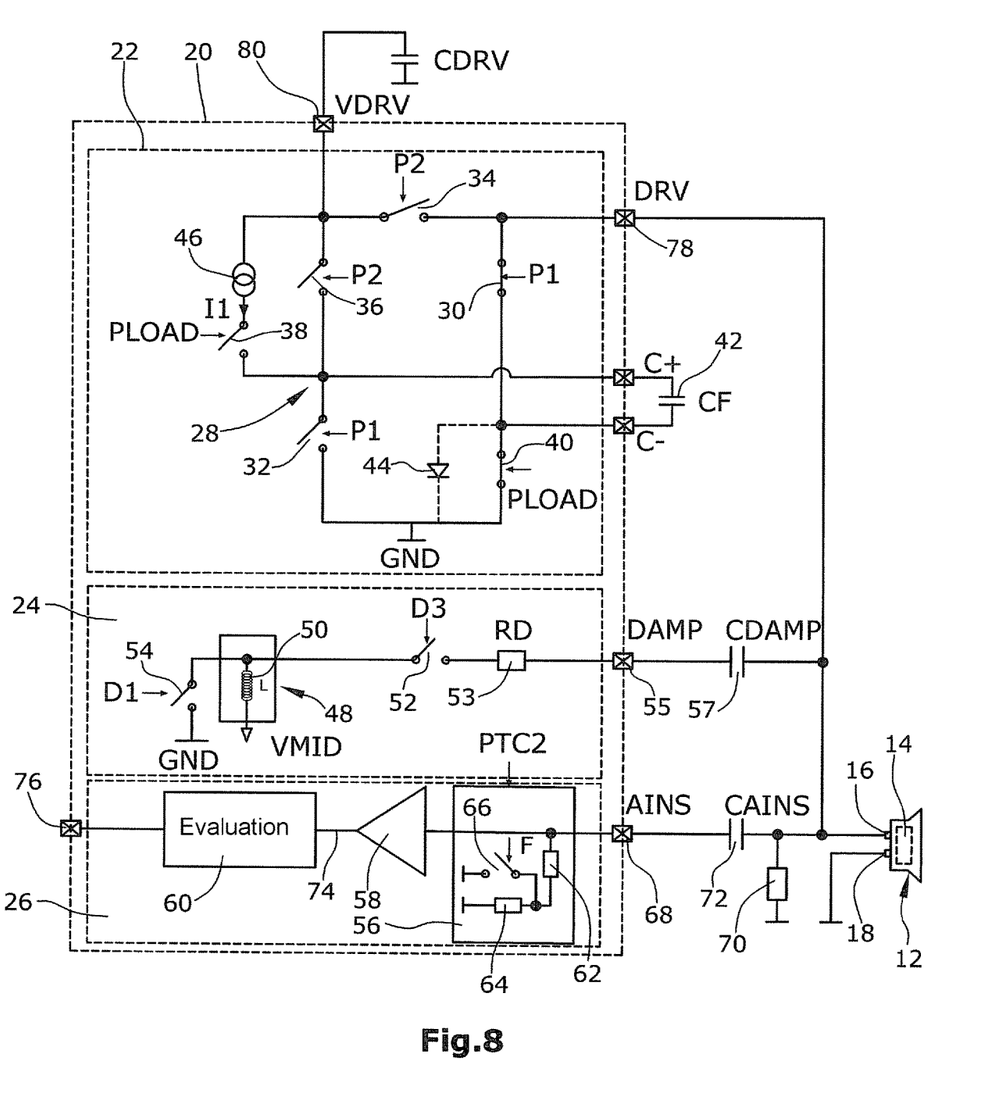

FIG. 8 illustrates an alternative to the pulse-shaped application of 0V to the output 78 of the driver stage 22. This can also be realized e.g. by closing the switches 30 and 40, while the switches 32, 34 and 36 are open. With these switch positions, the output 78 of the driver stage 22 is eventually also connected to ground.

Figure 9:
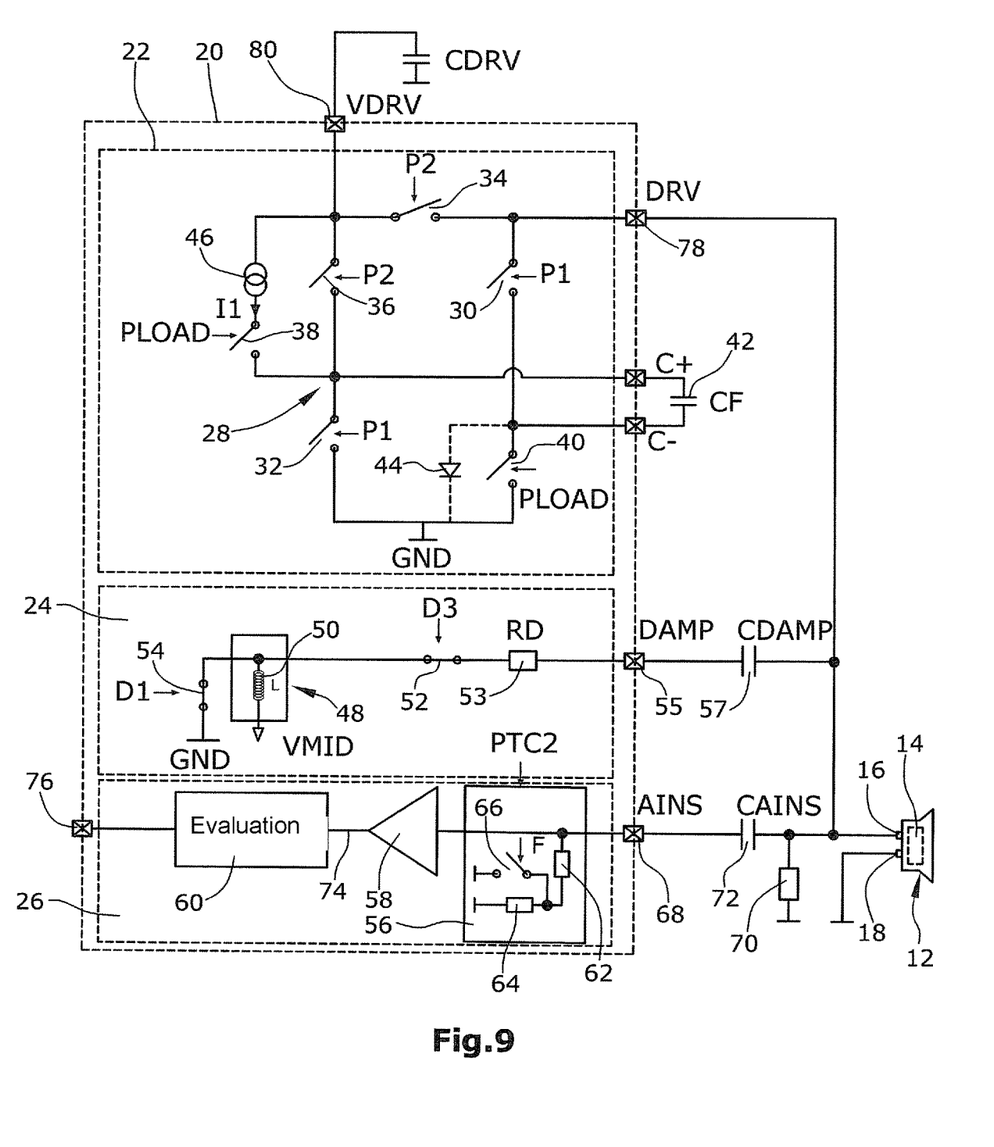

Finally, FIG. 9 shows a variant for the stop pulse generation (short-term application of 0 V to the output 78 of the driver stage 22) by closing the switches 52, 54 of the damping stage 24. However, this variant can be realized only if the decoupling capacitance 57 is not present. Basically, it applies for the decoupling capacitance 57 that it keeps the mean operating voltage VMID of the impedance converter circuit 48 from the signal terminal 16 of the ultrasonic transducer 12, which entails the advantage that the ultrasonic transducer 12 is not permanently supplied with a DC voltage during operation. The operating voltage VMID in turn is needed to realize the damping inductance 50 by means of the impedance converter circuit 48. Thus, it is a prerequisite of the presently described variant of the generation of a stop pulse of 0 V that the damping inductance 50 is not realized as an IC circuit. If a "real" coil (axial or planar) were used, the decoupling capacitance 57 would be obsolete and thus, e.g., a switch connected to ground would be present that would be closed for the generation of a stop pulse.

Figure 10:
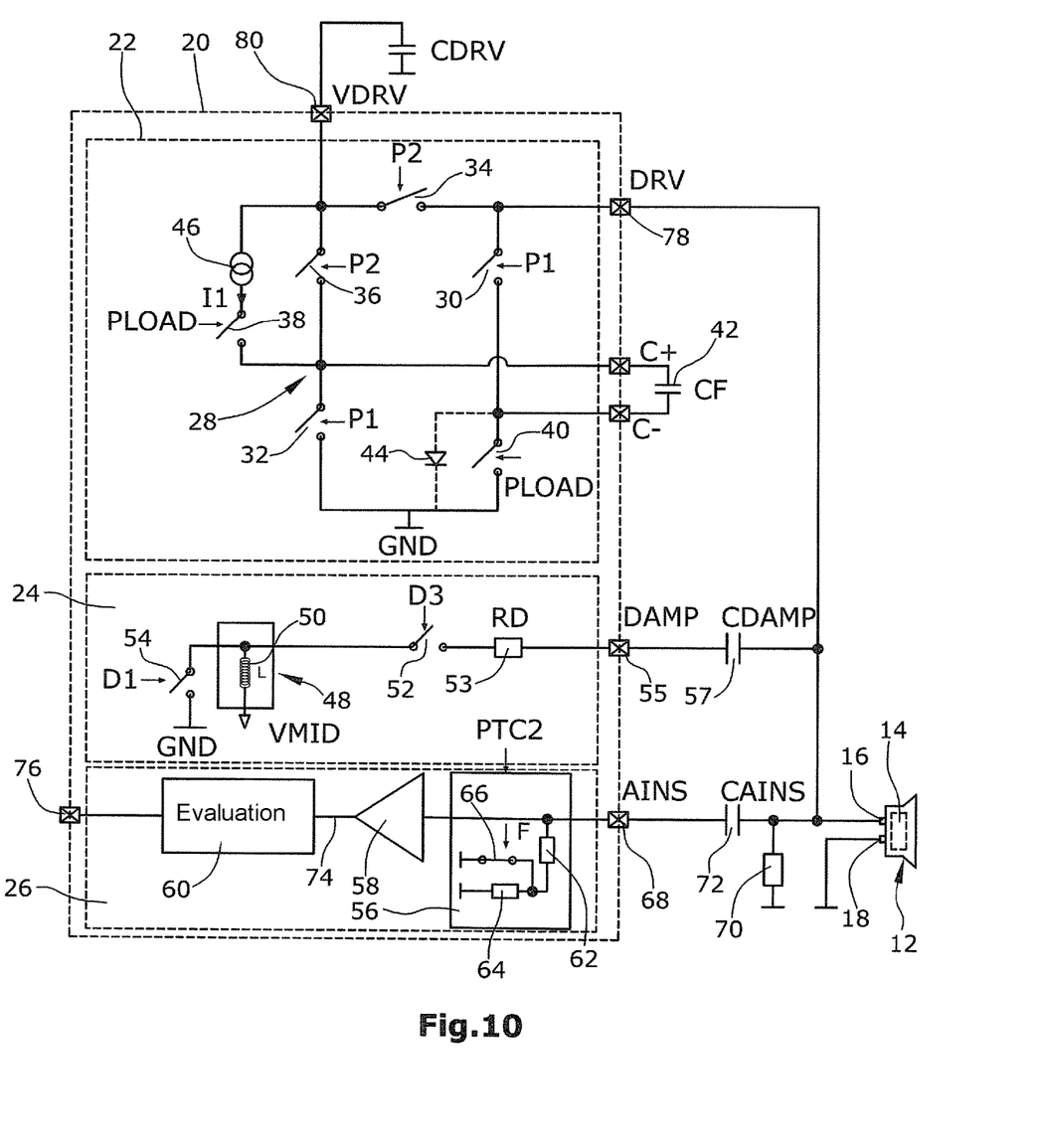

Lastly, FIG. 10 shows the constellation in which near the end of the decay phase, the integrated (IC) part of the filter 56 operates with a filter constant which causes a faster decay of the mean decay signal at the input of the amplifier. The switch 66 of the integrated (IC) part of the filter 56 is closed in this phase.

Due to the short-term compulsory application of 0 V to the output 78 of the driver stage 22 at the end of a transmission interval it is achieved that a voltage is present at the signal terminal 16 of the ultrasonic transducer 12, which is in that range of magnitude in which the stage 24 for the electric damping of the ultrasonic transducer 12 can already operate almost optimally. Thus, the signal at the signal terminal 16 of the ultrasonic transducer 12 decays faster. The switching of the filter constant of the filter 56 additionally causes the input of the amplifier 58 to follow the decay signal more quickly during the decay phase, so that the envelope does not suggests false echoes.

LIST OF REFERENCE NUMERALS 10 ultrasonic measuring system
12 ultrasonic transducer
14 oscillating element
16 signal terminal
18 ground terminal
20 control and evaluation unit
22 driver stage
24 damping stage
26 evaluation stage
28 bridge circuit
30 switch
32 switch
34 switch
36 switch
38 switch
40 switch
42 charge storage capacitance
44 diode
46 power source
48 impedance converter circuit
50 damping inductance
52 switch
53 resistor
54 switch
55 output
56 filter
58 amplifier
60 evaluation circuit
62 resistor
64 resistor
66 switch
68 input
70 resistor
72 decoupling capacitance
74 output
76 output
78 output
80 operating voltage potential VDRV

The invention claimed is:

1. An ultrasonic measuring system, in particular for distance measurement and/or as a parking assistant in vehicles, comprising an electro-acoustic ultrasonic transducer without a voltage converter and comprising a oscillating element, which transducer is configured to be operated alternately as an ultrasonic transmitter and as an ultrasonic receiver, and a signal terminal which serves either as an input or as an output of the ultrasonic transducer, and a ground terminal connected to ground, and a control and evaluation unit for exciting the oscillating element of the ultrasonic transducer for transmitting ultrasonic waves for the operation of the ultrasonic transducer during a transmission interval for the subsequent deactivation of excitation of the oscillating element as well as for damping the same during a decay phase and for receiving, as well as for processing ultrasonic waves in a receiving interval, wherein the control and evaluation unit comprises a bridge circuit connected to a supply DC voltage, said circuit comprising controllable switches and a reversible charge storage capacitance for alternately outputting a positive and a negative excitation voltage for the signal terminal of the ultrasonic transducer relative to ground during the transmission interval at an output terminal of a driver stage of the control and evaluation unit, wherein, by connecting the output terminal directly to ground or through a diode to ground, the control and evaluation unit outputs a voltage pulse at the end of the transmission interval for the signal terminal of the ultrasonic transducer, the magnitude of the pulse being substantially equal to the mean excitation voltage for the signal terminal of the ultrasonic transducer during the just ended transmission interval, and wherein a frequency for outputting control pulses during excitation of the ultrasonic transducer is f, and a duration of the voltage pulse at the end of the transmission interval is in a range from 0.25 times 1/f and 1.0 times 1/f.

2. The ultrasonic measuring system of claim 1, wherein, by connecting the output terminal to ground, the control and evaluation unit outputs a voltage pulse of 0 V at the end of the transmission interval for the signal terminal of the ultrasonic transducer.

3. The ultrasonic measuring system of claim 1, wherein the control and evaluation unit comprises a damping inductance which is activated by the control and evaluation unit at the end of the transmission interval at the earliest and can be deactivated during the duration of the decay phase.

4. The ultrasonic measuring system of claim 1, wherein the control and evaluation unit comprises an impedance converter circuit representing a damping inductance.

5. The ultrasonic measuring system of claim 4, wherein a decoupling capacitance is arranged between the impedance converter circuit and the signal terminal of the ultrasonic transducer for the DC voltage decoupling of the ultrasonic transducer with respect to the impedance converter circuit, and that the control and evaluation unit activates the impedance converter circuit at the end of the transmission interval at the earliest and deactivates the same during the duration of the decay phase.

6. The ultrasonic measuring system of claim 4, wherein the control and evaluation unit comprises an amplifier for performing an amplification of the signal at the signal terminal of the ultrasonic transducer at least during the receiving interval.

7. The ultrasonic measuring system of claim 6, wherein the amplifier comprises an input for the signal at the signal terminal of the ultrasonic transducer, and that a filter is arranged between the signal terminal of the ultrasonic transducer and the input of the amplifier.

8. The ultrasonic measuring system of claim 7, wherein the filter comprises a switchable filter constant for a faster decay of the mean decay signal at the signal terminal of the ultrasonic transducer during the decay phase.

9. The ultrasonic measuring system of claim 8, wherein the control and evaluation unit activates the switchable filter constant of the filter at the earliest upon the deactivation of the impedance converter circuit or the damping inductance, and deactivates the filter constant at the end of the decay phase, but at the latest prior to the start of the receiving interval.

10. The ultrasonic measuring system of claim 1, wherein the control and evaluation unit comprises a power source for charging the charge storage capacitance during at least a part of the duration of the decay phase and during the receiving interval.

11. An ultrasonic measuring system, in particular for distance measurement and/or as a parking assistant in vehicles, comprising
an electro-acoustic ultrasonic transducer without a voltage converter and comprising a oscillating element, which transducer is configured to be operated alternately as an ultrasonic transmitter and as an ultrasonic receiver, and a signal terminal which serves either as an input or as an output of the ultrasonic transducer, and a ground terminal connected to ground, and
a control and evaluation unit for exciting the oscillating element of the ultrasonic transducer for transmitting ultrasonic waves for the operation of the ultrasonic transducer during a transmission interval for the subsequent deactivation of excitation of the oscillating element as well as for damping the same during a decay phase and for receiving, as well as for processing ultrasonic waves in a receiving interval,
wherein the control and evaluation unit comprises a bridge circuit connected to a supply DC voltage, said circuit comprising controllable switches and a reversible charge storage capacitance for alternately outputting a positive and a negative excitation voltage for the signal terminal of the ultrasonic transducer relative to ground during the transmission interval at an output terminal of a driver stage of the control and evaluation unit,
wherein, by connecting the output terminal directly to ground or through a diode to ground, the control and evaluation unit outputs a voltage pulse at the end of the transmission interval for the signal terminal of the ultrasonic transducer, the magnitude of the pulse being substantially equal to the mean excitation voltage for the signal terminal of the ultrasonic transducer during the just ended transmission interval,
wherein the control and evaluation unit comprises an impedance converter circuit representing a damping inductance,
wherein the control and evaluation unit comprises an amplifier for performing an amplification of the signal at the signal terminal of the ultrasonic transducer at least during the receiving interval, the amplifier comprising an input for the signal at the signal terminal of the ultrasonic transducer, and
wherein a filter is arranged between the signal terminal of the ultrasonic transducer and the input of the amplifier, the filter comprising a switchable filter constant for a faster decay of the mean decay signal at the signal terminal of the ultrasonic transducer during the decay phase.

12. The ultrasonic measuring system of claim 11, wherein, by connecting the output terminal to ground, the control and evaluation unit outputs a voltage pulse of 0V at the end of the transmission interval for the signal terminal of the ultrasonic transducer.

13. The ultrasonic measuring system of claim 11, wherein the control and evaluation unit comprises a damping inductance which is activated by the control and evaluation unit at the end of the transmission interval at the earliest and can be deactivated during the duration of the decay phase.

14. The ultrasonic measuring system of claim 11, wherein a decoupling capacitance is arranged between the impedance converter circuit and the signal terminal of the ultrasonic transducer for the DC voltage decoupling of the ultrasonic transducer with respect to the impedance converter circuit, and that the control and evaluation unit activates the impedance converter circuit at the end of the transmission interval at the earliest and deactivates the same during the duration of the decay phase.

15. The ultrasonic measuring system of claim 11, wherein the control and evaluation unit activates the switchable filter constant of the filter at the earliest upon the deactivation of the impedance converter circuit or the damping inductance, and deactivates the filter constant at the end of the decay phase, but at the latest prior to the start of the receiving interval.

16. An ultrasonic measuring system, in particular for distance measurement and/or as a parking assistant in vehicles, comprising
an electro-acoustic ultrasonic transducer without a voltage converter and comprising a oscillating element, which transducer is configured to be operated alternately as an ultrasonic transmitter and as an ultrasonic receiver, and a signal terminal which serves either as an input or as an output of the ultrasonic transducer, and a ground terminal connected to ground, and
a control and evaluation unit for exciting the oscillating element of the ultrasonic transducer for transmitting ultrasonic waves for the operation of the ultrasonic transducer during a transmission interval for the subsequent deactivation of excitation of the oscillating element as well as for damping the same during a decay phase and for receiving, as well as for processing ultrasonic waves in a receiving interval,
wherein the control and evaluation unit comprises a bridge circuit connected to a supply DC voltage, said circuit comprising controllable switches and a reversible charge storage capacitance for alternately outputting a positive and a negative excitation voltage for the signal terminal of the ultrasonic transducer relative to ground during the transmission interval at an output terminal of a driver stage of the control and evaluation unit,
wherein the control and evaluation unit comprises an amplifier for performing an amplification of a signal at the signal terminal of the ultrasonic transducer at least during the receiving interval, the amplifier comprising an input for the signal at the signal terminal of the ultrasonic transducer,
wherein a filter is arranged between the signal terminal of the ultrasonic transducer and the input of the amplifier, the filter comprising a switchable filter constant for a faster decay of the mean decay signal at the signal terminal of the ultrasonic transducer during the decay phase;

wherein, by connecting the output terminal directly to ground or through a diode to ground, the control and evaluation unit outputs a voltage pulse at an end of the transmission interval for the signal terminal of the ultrasonic transducer, the magnitude of the pulse being substantially equal to a mean excitation voltage for the signal terminal of the ultrasonic transducer during a just ended transmission interval;

wherein the control and evaluation unit comprises an impedance converter circuit representing a damping inductance; and wherein a decoupling capacitance is arranged between the impedance converter circuit and the signal terminal of the ultrasonic transducer for a DC voltage decoupling of the ultrasonic transducer with respect to the impedance converter circuit, and that the control and evaluation unit activates the impedance converter circuit at the end of the transmission interval at the earliest and deactivates the same during the duration of the decay phase.

17. The ultrasonic measuring system of claim 16, wherein, by connecting the output terminal to ground, the control and evaluation unit outputs a voltage pulse of 0V at the end of the transmission interval for the signal terminal of the ultrasonic transducer.

18. The ultrasonic measuring system of claim 16, wherein the control and evaluation unit comprises a damping inductance which is activated by the control and evaluation unit at the end of the transmission interval at the earliest and can be deactivated during the duration of the decay phase.

* * * * *